(12) United States Patent
Ogumi

(10) Patent No.: US 11,705,415 B2
(45) Date of Patent: Jul. 18, 2023

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Taiichi Ogumi, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 128 days.

(21) Appl. No.: 17/329,856

(22) Filed: May 25, 2021

(65) Prior Publication Data

US 2021/0280543 A1 Sep. 9, 2021

Related U.S. Application Data

(62) Division of application No. 15/869,713, filed on Jan. 12, 2018, now Pat. No. 11,049,826.

(30) Foreign Application Priority Data

Jan. 16, 2017 (JP) ................. 2017-005272

(51) Int. Cl.
  *H01L 23/00* (2006.01)
  *H01L 25/065* (2023.01)
(52) U.S. Cl.
  CPC .............. *H01L 24/05* (2013.01); *H01L 24/03* (2013.01); *H01L 24/11* (2013.01); *H01L 24/13* (2013.01); *H01L 24/17* (2013.01); *H01L 25/0657* (2013.01); *H01L 24/81* (2013.01); *H01L 2224/02375* (2013.01); *H01L 2224/02377* (2013.01); *H01L 2224/02381* (2013.01); *H01L 2224/0401* (2013.01); *H01L 2224/05022* (2013.01); *H01L 2224/05166* (2013.01);
(Continued)

(58) Field of Classification Search
  CPC ......... H01L 21/50; H01L 24/03; H01L 24/17; H01L 24/14
  See application file for complete search history.

(56) References Cited

U.S. PATENT DOCUMENTS 5,329,423 A 7/1994 Scholz
8,421,241 B2 4/2013 Meghro et al.
(Continued)

FOREIGN PATENT DOCUMENTS

JP 2008218926 A 9/2008

*Primary Examiner* — Hoa B Trinh
(74) *Attorney, Agent, or Firm* — Volentine, Whitt & Francos, PLLC

(57) ABSTRACT

A semiconductor device includes: a first semiconductor chip; plural redistribution lines provided on a main face of the first semiconductor chip, the plural redistribution lines including a redistribution line that includes a first land and a redistribution line that includes a second land; a first electrode provided within the first land, one end of the first electrode being connected to the first land, and another end of the first electrode being connected to an external connection terminal; and a second electrode provided within the second land, one end of the second electrode being connected to the second land, wherein a shortest distance between an outer edge of the second land and an outer edge of the second electrode, is less than, a shortest distance between an outer edge of the first land and an outer edge of the first electrode.

3 Claims, 17 Drawing Sheets

(52) U.S. Cl.
CPC ........... *H01L 2224/05569* (2013.01); *H01L 2224/05572* (2013.01); *H01L 2224/05647* (2013.01); *H01L 2224/0603* (2013.01); *H01L 2224/06131* (2013.01); *H01L 2224/11903* (2013.01); *H01L 2224/13024* (2013.01); *H01L 2224/13111* (2013.01); *H01L 2224/16145* (2013.01); *H01L 2224/1703* (2013.01); *H01L 2224/17051* (2013.01); *H01L 2225/06513* (2013.01); *H01L 2225/06517* (2013.01); *H01L 2924/3511* (2013.01)

(56) References Cited

U.S. PATENT DOCUMENTS

| | | | |
|---|---|---|---|
| 2005/0121773 A1* | 6/2005 | Hasegawa | H01L 25/50 257/704 |
| 2012/0018876 A1 | 1/2012 | Wu et al. | |
| 2014/0151874 A1 | 6/2014 | Obu et al. | |
| 2015/0179616 A1* | 6/2015 | Lin | H01L 23/3121 257/773 |
| 2016/0086902 A1 | 3/2016 | Lu et al. | |
| 2019/0245543 A1* | 8/2019 | Lee | G11C 11/412 |

\* cited by examiner

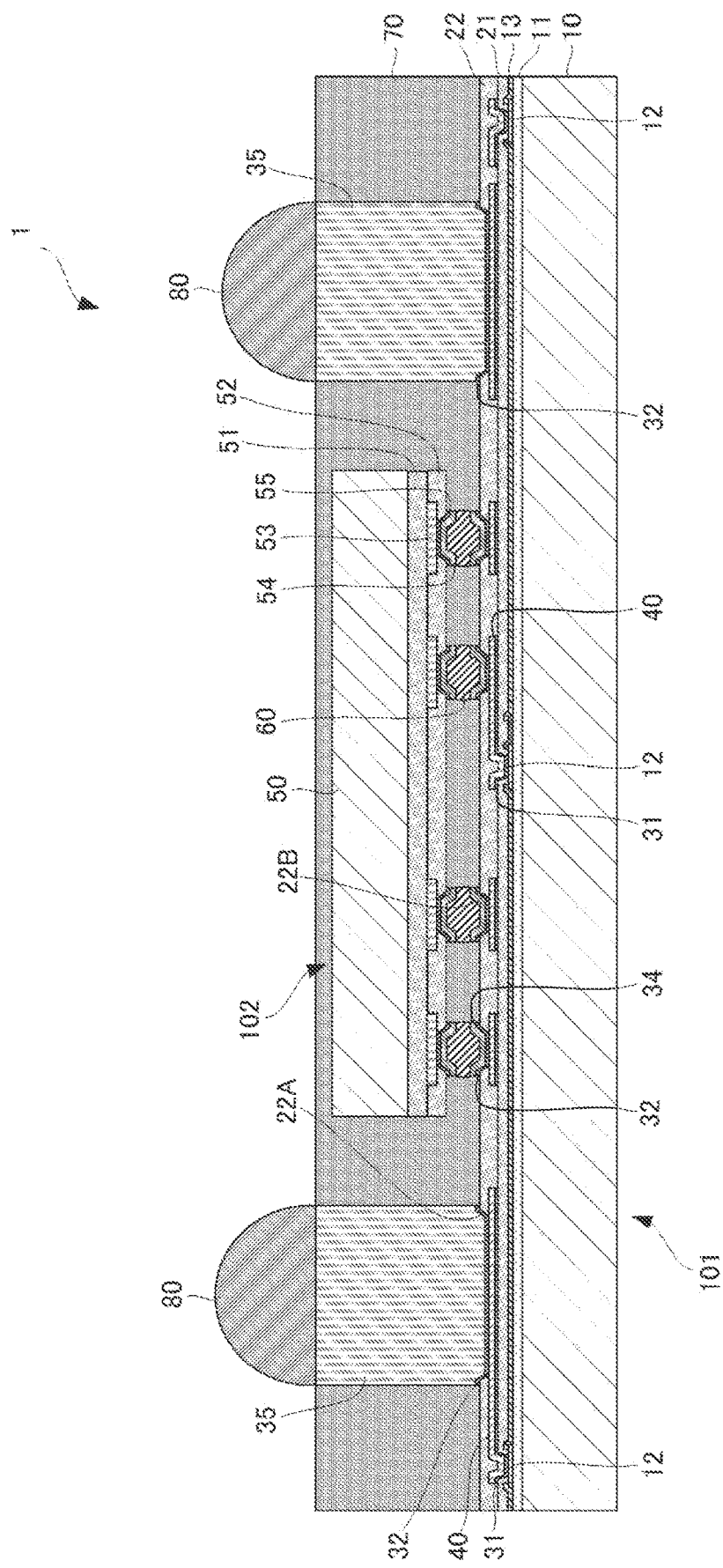

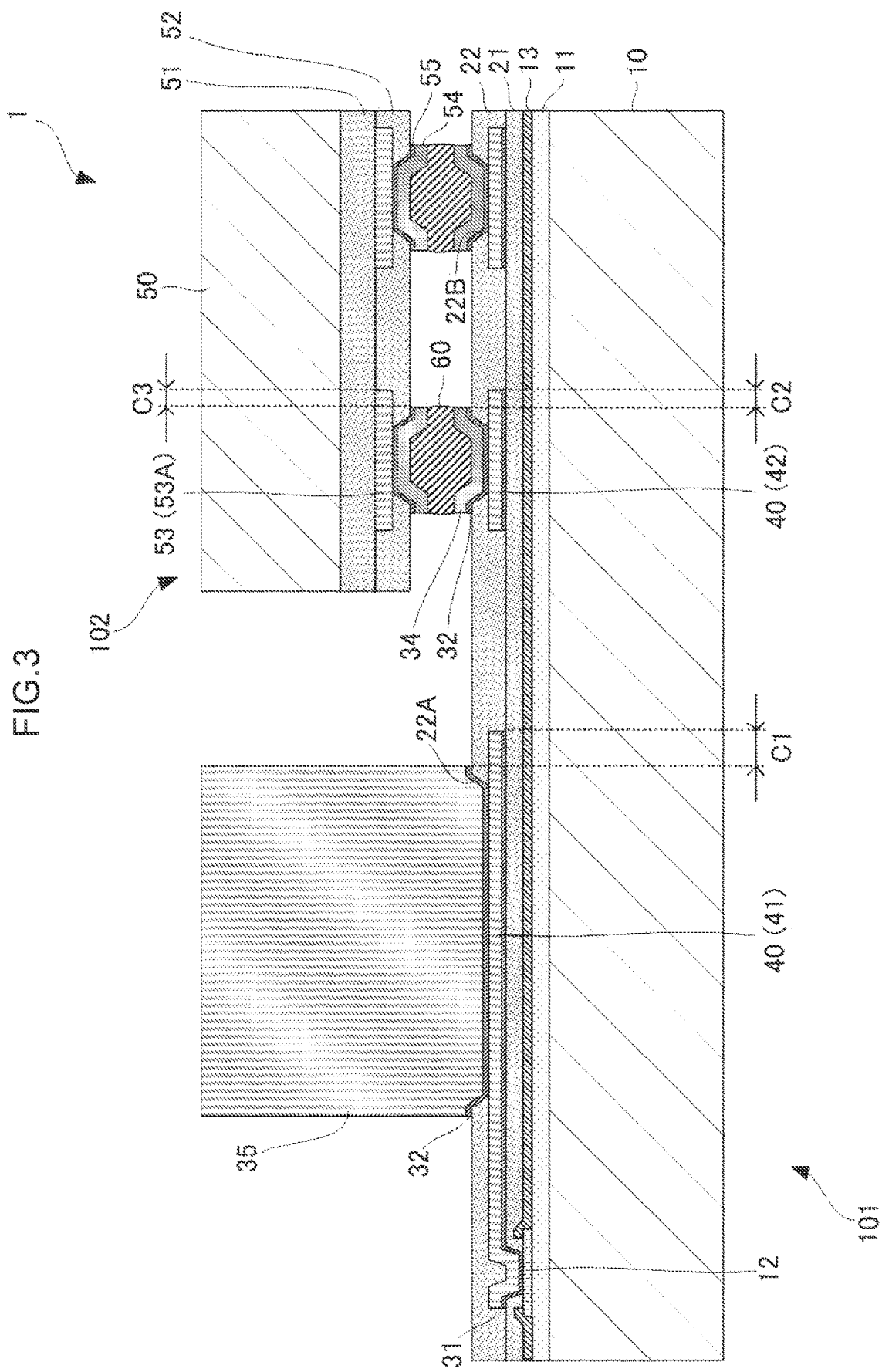

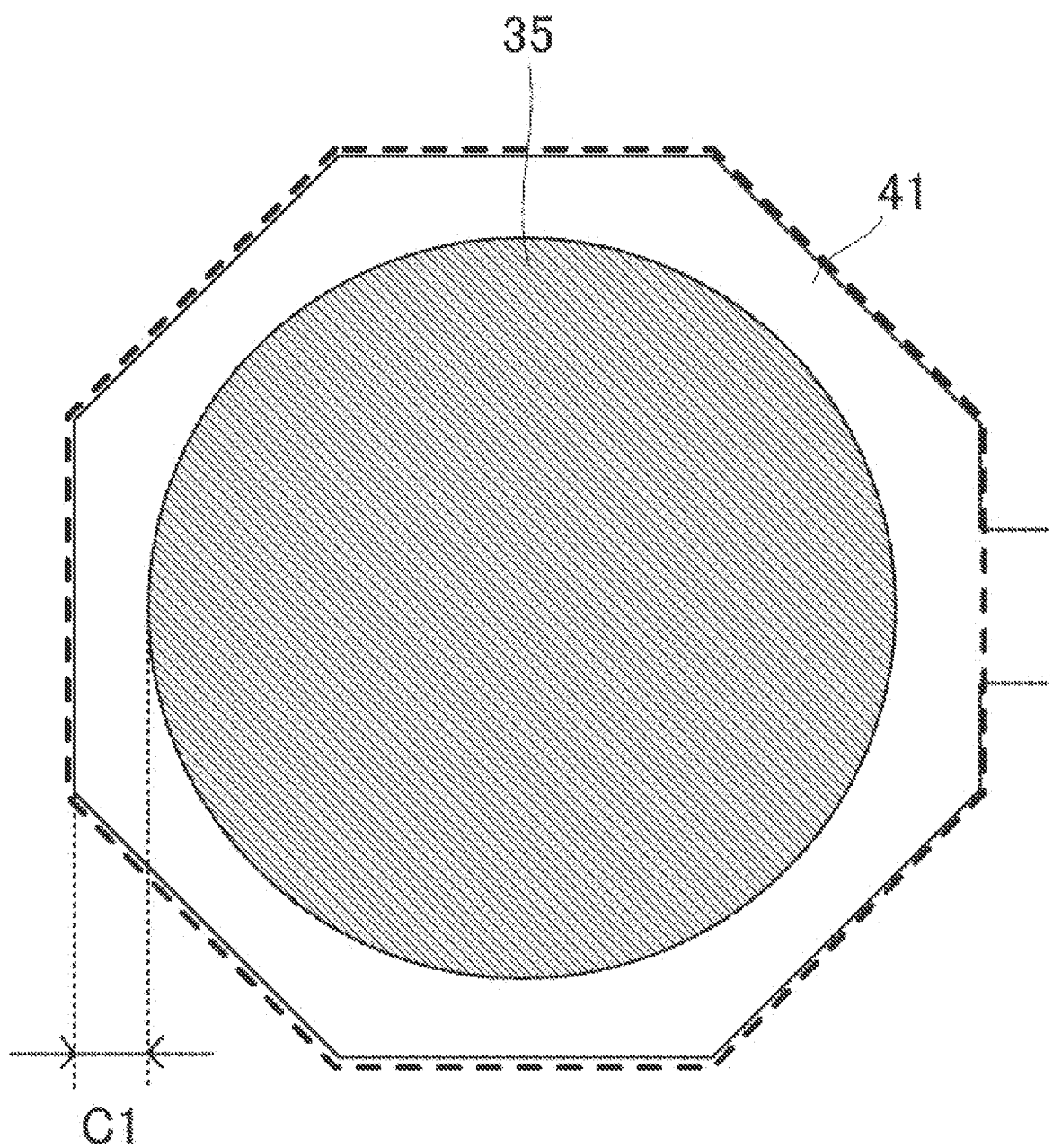

SEMICONDUCTOR DEVICE AND SEMICONDUCTOR DEVICE MANUFACTURING METHOD

CROSS-REFERENCE TO RELATED APPLICATION

This application is a divisional application of application Ser. No. 15/869,713 filed on Jan. 12, 2018, now U.S. Pat. No. 11,049,826 issued on Jun. 29, 2021, which application claims priority under 35 USC 119 from Japanese Patent Application No. 2017-005272, filed on Jan. 16, 2017, the disclosure of which is incorporated by reference herein.

BACKGROUND

Technical Field

The present disclosure relates to a semiconductor device and a semiconductor device manufacturing method.

Related Art

Wafer-level chip-size packaging (WL-CSP) is packaging technology for semiconductor devices in which redistribution wiring, electrode formation, resin encapsulation, and dicing are all performed in a wafer process. Multi-chip WL-CSP, in which plural semiconductor chips are stacked, is also known.

In Multi-chip WL-CSP, the planar size of the package is substantially the same as the planar size of any semiconductor chip packaged in the package, and the height of the package is substantially the same as the height of the stack of plural semiconductor chips packaged inside the package, thereby enabling package size to be reduced while still realizing high performance semiconductor devices. Moreover, since connections between the plural semiconductor chips are made using flip chip bonding, wire bonding is unnecessary, enabling improved performance due to, for example, suppressing communication lag between the semiconductor chips.

Japanese Patent Application Laid-Open (JP-A) No. 2008-218926 describes a semiconductor device including a second semiconductor chip that has been flip chip bonded to a first semiconductor chip.

One issue with multi-chip WL-CSP in which a second semiconductor chip has been mounted on a first semiconductor chip is reliably in connecting the first semiconductor chip and the second semiconductor chip.

A typical WL-CSP includes redistribution lines on the faces of semiconductor chips formed with elements. Normally, the redistribution lines are formed by plating, with the thickness thereof being comparatively thick at about 5 μm, and this may cause warpage in the semiconductor chip. In a multi-chip WL-CSP, a face of a first semiconductor chip in which elements and redistribution lines are formed, and a face of a second semiconductor chip in which elements and redistribution lines are formed, are stacked so as to face with each other. Accordingly, the two semiconductor chips are stacked in a state in which the two semiconductor chips are both warped in mutually opposite directions. In the above configuration, the connection of semiconductor chips having warpage in mutually opposite directions may be more difficult than connecting a semiconductor chip to a wiring substrate.

FIG. 1A and FIG. 1B are cross-sectional views illustrating examples of connection states between semiconductor chips, in a semiconductor device configured by stacking a first semiconductor chip 501 and a second semiconductor chip 502 that are warped in opposite directions. As illustrated in FIG. 1A and FIG. 1B, in cases in which the first semiconductor chip 501 and the second semiconductor chip 502 are each warped in opposite directions, a location may arise where an inner connection terminal 510 formed on the second semiconductor chip 502 and configured by solder or the like, does not make contact with an electrode 520 formed on the first semiconductor chip 501. Accordingly, an open fault may occur in such semiconductor device. However, in the technology described in JP-A 2008-218926, no consideration is given to occurrence of warpage of the semiconductor chip due to redistribution lines.

SUMMARY

The present disclosure provides a semiconductor device and a semiconductor device manufacturing method that may suppress the occurrence of warpage of a semiconductor chip due to redistribution lines.

A first aspect of the present disclosure is a semiconductor device including: a first semiconductor chip; plural redistribution lines provided on a main face of the first semiconductor chip, the plural redistribution lines including a redistribution line that includes a first land and a redistribution line that includes a second land; a first electrode provided in a region encompassed by the first land in plan view, one end of the first electrode in a stacking direction of the first semiconductor chip and the plural redistribution lines being connected to the first land, and another end of the first electrode in the stacking direction being connected to an external connection terminal; and a second electrode provided in a region encompassed by the second land in plan view, one end of the second electrode in the stacking direction being connected to the second land, wherein a shortest distance between an outer edge of the second land and an outer edge of the second electrode in plan view, is less than, a shortest distance between an outer edge of the first land and an outer edge of the first electrode in plan view.

A second aspect of the present disclosure is a semiconductor device including: a first semiconductor chip; plural redistribution lines provided on a main face of the first semiconductor chip, the plural redistribution lines including a redistribution line that includes a first land and a redistribution line that includes a second land, the second land having a surface area that is less than a surface area of the first land; a first electrode provided in a region encompassed by the first land in plan view, one end of the first electrode in a stacking direction of the first semiconductor chip and the plural redistribution lines being connected to the first land, and another end of the first electrode in the stacking direction being connected to an external connection terminal; and a second electrode provided in a region encompassed by the second land in plan view, one end of the second electrode in the stacking direction being connected to the second land.

A third aspect of the present disclosure is a semiconductor device manufacturing method including: forming, on a main face of a first semiconductor chip, plural redistribution lines including a redistribution line that includes a first land and a redistribution line that includes a second land, the second land having a surface area that is less than a surface area of the first land; forming a first electrode in a region encompassed by the first land in plan view, one end of the first electrode in a stacking direction of the first semiconductor chip and the plural redistribution lines being connected to the first land; forming a second electrode in a region encompassed by the second land in plan view, one end of the second electrode in the stacking direction being connected to the second land; connecting a third electrode provided on a main face of a second semiconductor chip to the second electrode to mount the second semiconductor chip on the first semiconductor chip; and forming an external connection terminal at another end of the first electrode in the stacking direction, wherein a shortest distance between an outer edge of the second land and an outer edge of the second electrode in plan view, is less than, a shortest distance between an outer edge of the first land and an outer edge of the first electrode in plan view.

According to the above aspects, the present disclosure provides a semiconductor device and a manufacturing method that may suppress the occurrence of warpage of a semiconductor chip due to redistribution lines.

BRIEF DESCRIPTION OF THE DRAWINGS

Exemplary embodiments will be described in detail based on the following figures, wherein:

FIG. 2 is a cross-sectional view illustrating configuration of a semiconductor device according to an exemplary embodiment of the present disclosure;

FIG. 3 is an enlarged cross-sectional view illustrating configuration of part of a semiconductor device according to an exemplary embodiment of the present disclosure;

FIG. 5A is an enlarged plan view illustrating a first land and a columnar electrode according to an exemplary embodiment of the present disclosure;

DETAILED DESCRIPTION

Figure 1A:
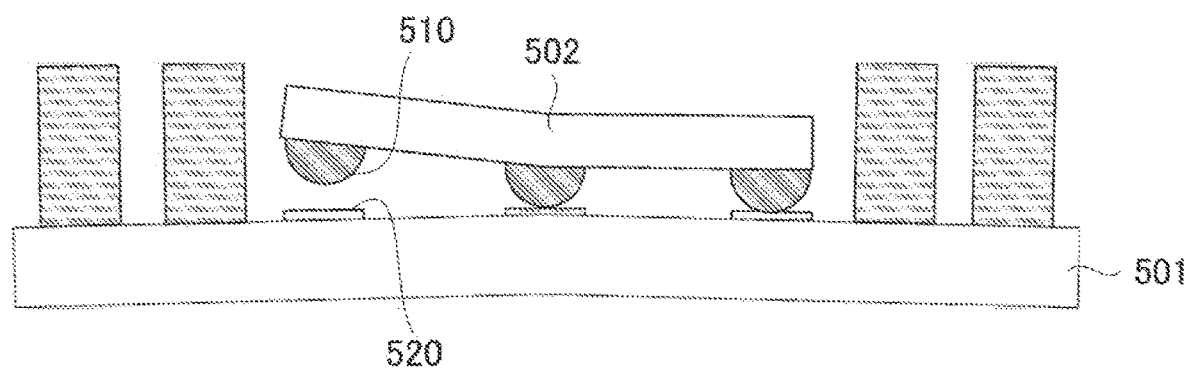
FIG. 1A and FIG. 1B are cross-sectional views illustrating examples of connection states between semiconductor chips in a semiconductor device configured by stacking two semiconductor chips that are warped in opposite directions.

Explanation follows regarding exemplary embodiments of the present disclosure, with reference to the drawings. Note that in the drawings, configuration elements and portions that are the same or equivalent in practice are allocated the same reference numerals.

FIG. 2 is a cross-sectional view illustrating the overall configuration of a semiconductor device 1 according to an exemplary embodiment of the present disclosure. FIG. 3 is an enlarged cross-sectional view illustrating the configuration of part of the semiconductor device 1.

The semiconductor device 1 includes a first semiconductor chip 101, redistribution lines 40 provided on a main face of the first semiconductor chip 101, and a second semiconductor chip 102 that is stacked on the first semiconductor chip 101 and connected to the first semiconductor chip 101 through the redistribution lines 40. The semiconductor device 1 further includes an encapsulation resin 70, columnar electrodes 35, and external connection terminals 80. The encapsulation resin 70 covers the main face of the first semiconductor chip 101 such that the second semiconductor chip 102 is embedded within the encapsulation resin 70. The columnar electrodes 35 penetrate the encapsulation resin 70 so as to reach the redistribution lines 40. The external connection terminals 80 are provided to the tips of the columnar electrodes 35. Note that the encapsulation resin 70 and the external connection terminal 80 are omitted from illustration in FIG. 3.

The semiconductor device 1 is packaged using multi-chip WL-CSP. Namely, in the semiconductor device 1, the planar size of the package is substantially the same as the planar size of the first semiconductor chip 101, and the height of the package is substantially the same as the height of the stacked first semiconductor chip 101 and second semiconductor chip 102.

Circuit elements (not illustrated in the drawings) such as transistors, resistive elements, and capacitors are formed on a front face of a semiconductor substrate 10 configuring the first semiconductor chip 101. The front face of the semiconductor substrate 10 is covered by an inter-layer insulating film 11 configured by an insulator such as $SiO_2$. Chip electrodes 12 connected to the circuit elements formed on the semiconductor substrate 10, and a passivation film (protective film) 13 with openings that partially expose front faces of the chip electrodes 12, are both provided on a front face of the inter-layer insulating film 11.

A front face of the passivation film 13 is covered by a lower-layer insulating film 21 formed configured by photosensitive organic insulating material such as polyimide or polybenzoxazole (PBO). The lower-layer insulating film 21 is provided with openings that partially expose the front faces of the chip electrodes 12.

Each of the redistribution lines 40 is provided on a front face of the lower-layer insulating film 21 with a first under bump metallurgy (UBM) film 31 interposed therebetween. The first UBM film 31 is, for example, configured by a film stack including a Ti film and a Cu film. The Ti film functions as an adhesion layer to increase adhesion between the lower-layer insulating film 21 and the redistribution lines 40. The Cu film functions as a plating seed layer used to form the redistribution lines 40 in an electroplating method. Each of the redistribution lines 40 is, for example, configured by a conductor such as Cu. The redistribution lines 40 are respectively connected to the chip electrodes 12 through the first UBM film 31 at the openings in the lower-layer insulating film 21. The Cu film configuring the first UBM film 31 is incorporated into the Cu configuring the redistribution lines 40. A structure is thereby obtained in which a Ti film, functioning as an adhesion layer, is interposed between the lower-layer insulating film 21 and the redistribution lines 40.

Front faces of the lower-layer insulating film 21 and the redistribution lines 40 are covered by an upper-layer insulating film 22 configured by a photosensitive organic insulating material such as polyimide or PBO. The upper-layer insulating film 22 is provided with first openings 22A that partially expose the redistribution lines 40 at positions where the columnar electrodes 35 are formed, and with second openings 22B that partially expose the redistribution lines 40 at the positions where the chip interconnection electrodes 34 are formed.

The columnar electrodes 35 and the chip interconnection electrodes 34 are provided on the upper-layer insulating film 22. In plan view, the columnar electrodes 35 are formed in regions encompassing the first openings 22A in the upper-layer insulating film 22. The columnar electrodes 35 are respectively connected, through a second UBM film 32, to the portions of the redistribution lines 40 exposed through the first openings 22A. Cu, which is easy to work with, may preferably be employed as the material used for the columnar electrodes 35. The columnar electrodes 35 have, for example, cylindrical profiles.

In plan view, the chip interconnection electrodes 34 are formed in regions encompassing the second openings 22B in the upper-layer insulating film 22. The chip interconnection electrodes 34 are respectively connected, through the second UBM film 32, to the portions of the redistribution lines 40 exposed through the second openings 22B. The chip interconnection electrodes 34 are, for example, configured by a metal that does not diffuse into solder containing SnAg. Ni, for example, may preferably be employed as the material used for the chip interconnection electrodes 34. Namely, the chip interconnection electrodes 34 are configured from a material differing from that of the columnar electrodes 35.

The second UBM film 32 is provided between the redistribution lines 40 and the columnar electrodes 35, and between the redistribution lines 40 and the chip interconnection electrodes 34. Similarly to the first UBM film 31, the second UBM film 32 is configured by a film stack including a Ti film that functions as an adhesion layer, and a Cu film that functions as a plating seed layer. The Cu film configuring the second UBM film 32 is incorporated into the Cu configuring the columnar electrodes 35. A structure is thereby obtained in which a Ti film, functioning as an adhesion layer, is interposed between the columnar electrodes 35 and the redistribution lines 40. A structure is also obtained in which a film stack including a Ti film and a Cu film is interposed between the chip interconnection electrodes 34 and the redistribution lines 40.

The second semiconductor chip 102 is disposed on the first semiconductor chip 101 in a state in which a face on which circuit elements (not illustrated in the drawings) are formed opposes the first semiconductor chip 101. The second semiconductor chip 102 has a structure the same as, or similar to, that of the first semiconductor chip 101. Namely, a front face of a semiconductor substrate 50 configuring the second semiconductor chip 102 is provided with a lower-layer insulating film 51 configured by a photosensitive organic insulating material such as polyimide or PBO, and redistribution lines 53 are provided on the lower-layer insulating film 51. The redistribution lines 53 are connected, through chip electrodes (not illustrated in the drawings) that are provided on the front face of the semiconductor substrate 50, to circuit elements such as transistors (not illustrated in the drawings) that are provided on the front face of the semiconductor substrate 50.

Front faces of the lower-layer insulating film 51 and the redistribution lines 53 are covered by an upper-layer insulating film 52 configured by a photosensitive organic insulating material such as polyimide or PBO. The upper-layer insulating film 52 is provided with openings that partially expose the redistribution lines 53 at positions where the chip interconnection electrodes 54 are formed.

The chip interconnection electrodes 54 are provided on the upper-layer insulating film 52. In plan view, the chip interconnection electrodes 54 are formed in regions encompassing the openings in the upper-layer insulating film 52. The chip interconnection electrodes 54 are respectively connected to an exposed portion of the redistribution lines 53 through a UBM film 55. The chip interconnection electrodes 54 are, for example, configured by a metal that does not diffuse into solder containing SnAg. Ni, for example, may preferably be employed as the material used for the chip interconnection electrodes 54. The UBM film 55 is configured by a film stack including a Ti film that functions as an adhesion layer, and a Cu film that functions as a plating seed layer.

The chip interconnection electrodes 54 of the second semiconductor chip 102 are connected to the chip interconnection electrodes 34 of the first semiconductor chip 101 through solder terminals 60 configured by, for example, SnAg solder or the like. The circuit elements formed to the second semiconductor chip 102 are electrically connected to the circuit elements formed on the first semiconductor chip 101 or to the columnar electrodes 35 (external connection terminals 80) through the chip interconnection electrodes 34 and the redistribution lines 40 on the first semiconductor chip 101 side.

The encapsulation resin 70 is provided to the first semiconductor chip 101 on the side of a face joined to the second semiconductor chip 102. The second semiconductor chip 102 and the columnar electrodes 35 are embedded within the encapsulation resin 70. The joints (solder terminals 60) between the chip interconnection electrodes 34 and the chip interconnection electrodes 54, and the area around the columnar electrodes 35 and the second semiconductor chip 102, are covered by the encapsulation resin 70. The tips of the columnar electrodes 35 are exposed from the front face of the encapsulation resin 70. The external connection terminals 80 configured by SnAg solder or the like are provided at the tips of the columnar electrodes 35. The external connection terminals 80 of the semiconductor device 1 are connected to a wiring substrate (not illustrated in the drawings) so as to mount the semiconductor device 1 on the wiring substrate.

Figure 1B:
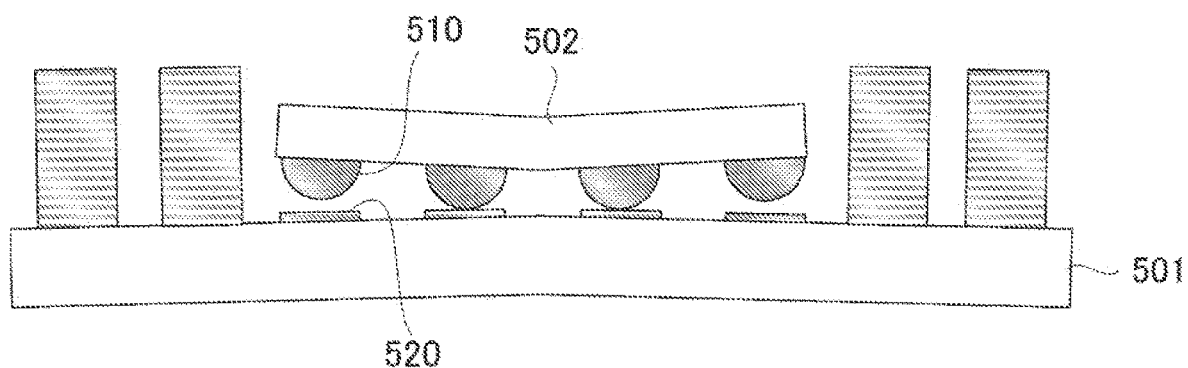

Note that, in the example illustrated in FIG. 1, a face of the second semiconductor chip 102 on the opposite side to the face joined to the first semiconductor chip 101 (this face is referred to hereafter as the "back face") is covered by the encapsulation resin 70. However, the back face of the second semiconductor chip 102 may be exposed from the encapsulation resin 70.

Figure 4:
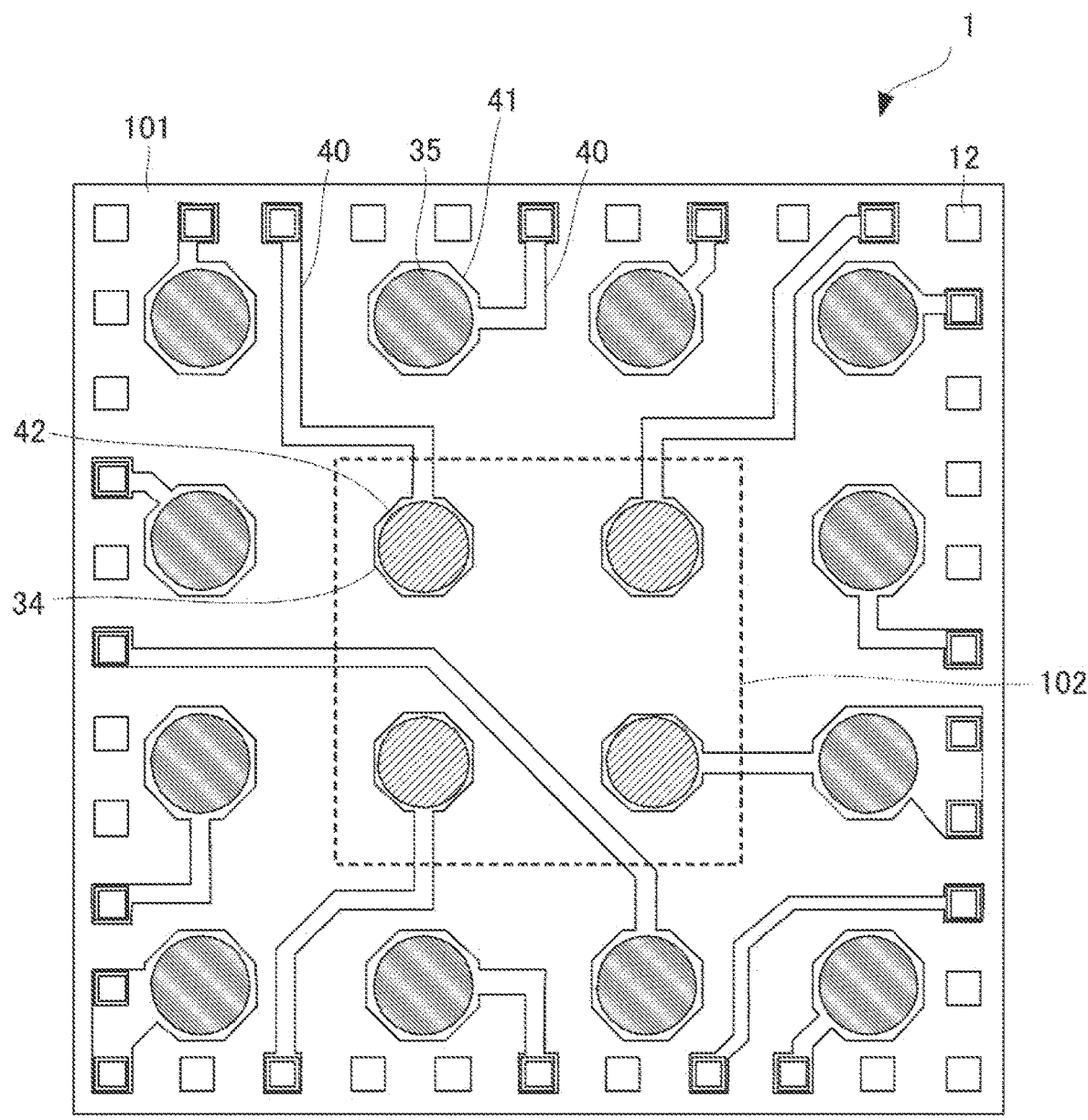
FIG. 4 is a plan view illustrating a configuration of redistribution lines, columnar electrodes, and chip interconnection electrodes according to an exemplary embodiment of the present disclosure.

FIG. 4 is a plan view illustrating an example of configuration of the redistribution lines 40, the columnar electrode 35, and the chip interconnection electrode 34. As illustrated in FIG. 4, the chip electrodes 12 of the first semiconductor chip 101 are disposed along the edges of the rectangularly shaped first semiconductor chip 101. One end of each of the redistribution lines 40 is connected to a respective chip electrode 12, and the redistribution lines 40 are drawn toward the inside in the plane direction of the first semiconductor chip 101. The other end of each of the redistribution lines 40 is connected to a respective columnar electrode 35 or chip interconnection electrode 34.

First lands 41, serving as pedestals for the columnar electrodes 35, are provided at the ends of the redistribution lines 40 connected to the columnar electrodes 35. Each of the columnar electrodes 35 is provided in a region encompassed by the respective first land 41 in plan view. One end of each of the columnar electrodes 35 in the stacking direction of the semiconductor chips is connected to the respective first land 41, and the other end of each of the columnar electrodes 35 in the stacking direction of the semiconductor chips is connected to the respective external connection terminal 80. Namely, the columnar electrodes 35 are provided at positions such that their outer edges do not protrude past the outer edges of the first lands 41 in the plane direction.

Second lands 42, serving as pedestals for the chip interconnection electrodes 34, are provided at the ends of the redistribution lines 40 connected to the chip interconnection electrodes 34. Each of the chip interconnection electrodes 34 is provided in region encompassed by the respective second land 42 in plan view. One end of each of the chip interconnection electrodes 34 in the stacking direction of the semiconductor chips is connected to the respective second land 42, and the other end of each of the chip interconnection electrodes 34 in the stacking direction of the semiconductor chips is connected to the respective solder terminal 60. Namely, the chip interconnection electrodes 34 are provided at positions such that their outer edges do not protrude past the outer edges of the second lands 42 in the plane direction.

In the present exemplary embodiment, the chip interconnection electrodes 34 are disposed clustered around a central portion of the first semiconductor chip 101, and the columnar electrodes 35 are disposed so as to surround the outer periphery of the chip interconnection electrodes 34. The second semiconductor chip 102 is mounted on the first semiconductor chip 101 at the central portion of the first semiconductor chip 101 where the chip interconnection electrodes 34 are disposed clustered together.

Figure 5B:
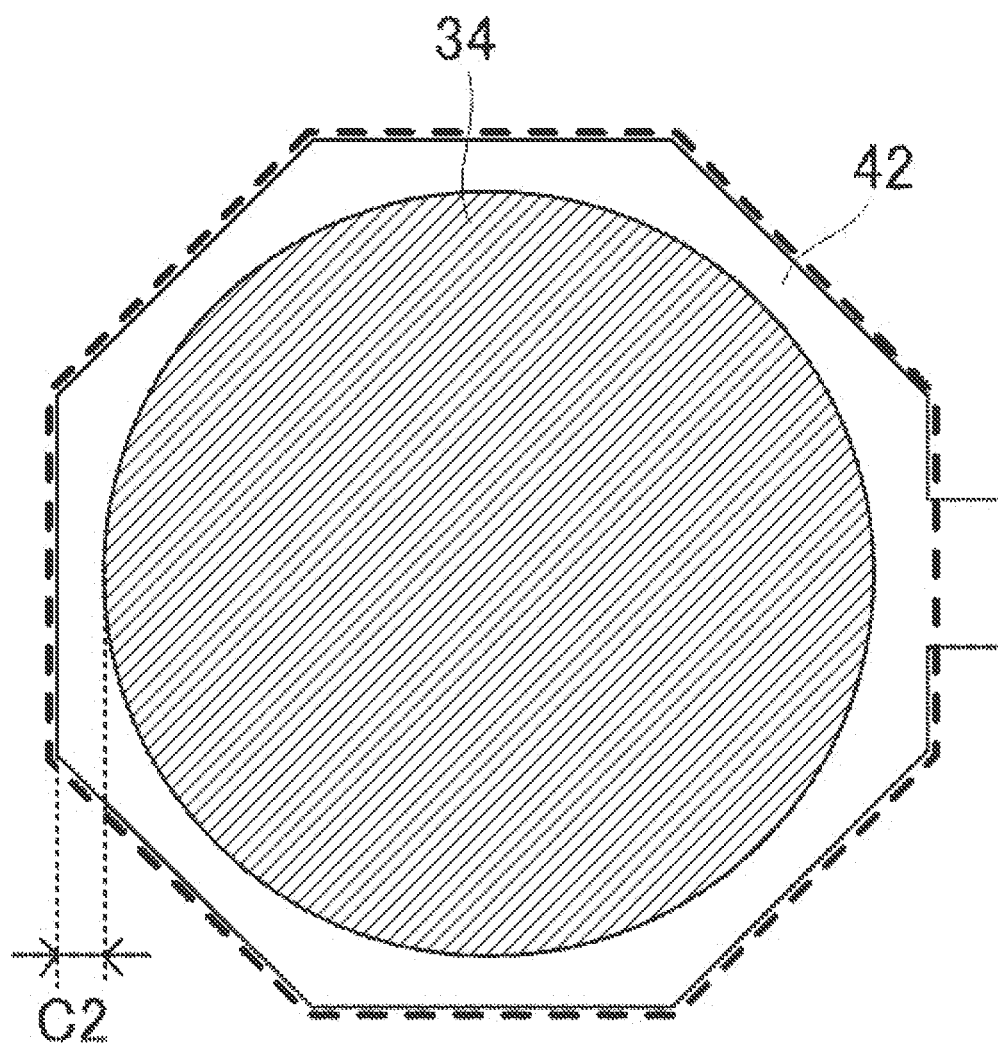
FIG. 5B is an enlarged plan view illustrating a second land and a chip interconnection electrode according to an exemplary embodiment of the present disclosure.

FIG. 5A is an enlarged plan view illustrating a first land 41 and a columnar electrode 35, and FIG. 5B is an enlarged plan view illustrating a second land 42 and a chip interconnection electrode 34. A clearance C2, which is the shortest distance between the outer edges of the second lands 42 and the outer edges of the chip interconnection electrodes 34 in plan view, is less than, a clearance C1, which is the shortest distance between the outer edges of the first lands 41 and the outer edges of the columnar electrodes 35 in plan view. The surface area of each second land 42 is less than the surface area of each first land 41. Note that the surface area of each second land 42 is the surface area of the semiconductor pattern to the inside of the region surrounded by the dashed line in FIG. 5B, and the surface area of each first land 41 is the surface area of the semiconductor pattern to the inside of the region surrounded by the dashed line in FIG. 5A.

One end of each of the redistribution lines 53 of the second semiconductor chip 102 is connected to a respective chip electrode (not illustrated in the drawings) provided to the second semiconductor chip 102 and is drawn toward the inside in the plane direction of the second semiconductor chip 102. The other end of each of the redistribution lines 53 is connected to a respective chip interconnection electrode 54. Third lands 53A (see FIG. 3), serving as pedestals for the chip interconnection electrodes 54, are provided to the other ends of redistribution lines 53. Each of the chip interconnection electrodes 54 is provided in region encompassed by the respective third land 53A in plan view. One end of each of the chip interconnection electrodes 54 in the stacking direction of the semiconductor chips is connected to the respective third land 53A, and the other end of each of the chip interconnection electrodes 54 in the stacking direction of the semiconductor chips is connected to a respective solder terminal 60. Namely, the chip interconnection electrodes 54 are provided at positions such that their outer edges do not protrude past the outer edges of the third lands 53A in the plane direction. A clearance C3 (see FIG. 3), which is the shortest distance between the outer edges of the third lands 53A and the outer edges of the chip interconnection electrodes 54 in plan view, is less than, the clearance C1, which is the shortest distance between the outer edges of the first lands 41 and the outer edges of the columnar electrodes 35 in plan view. The surface area of each third land 53A is less than the surface area of each first land 41.

Figure 6A:
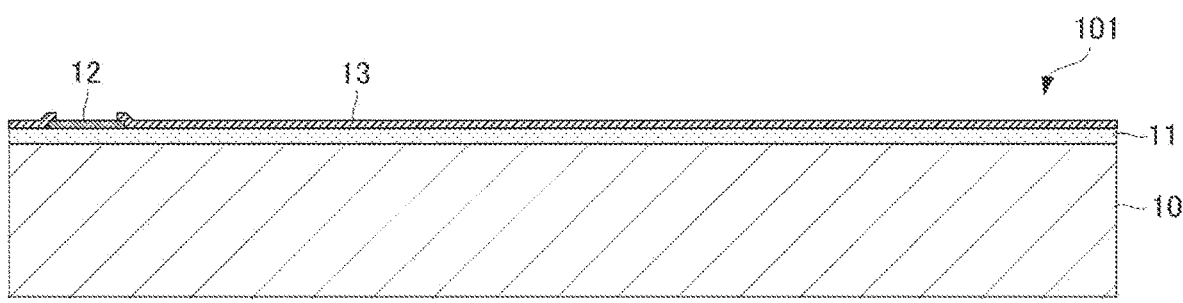
FIG. 6A to FIG. 6U are cross-sectional views illustrating manufacturing processes of a semiconductor device according to an exemplary embodiment of the present disclosure.
Figure 6B:
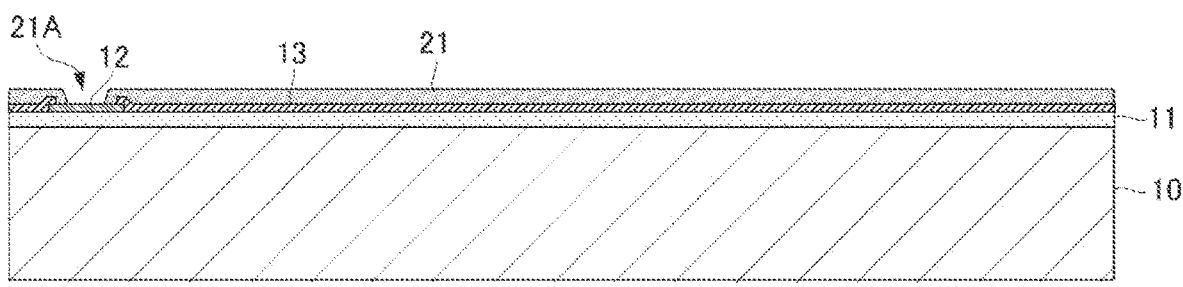
Figure 6C:
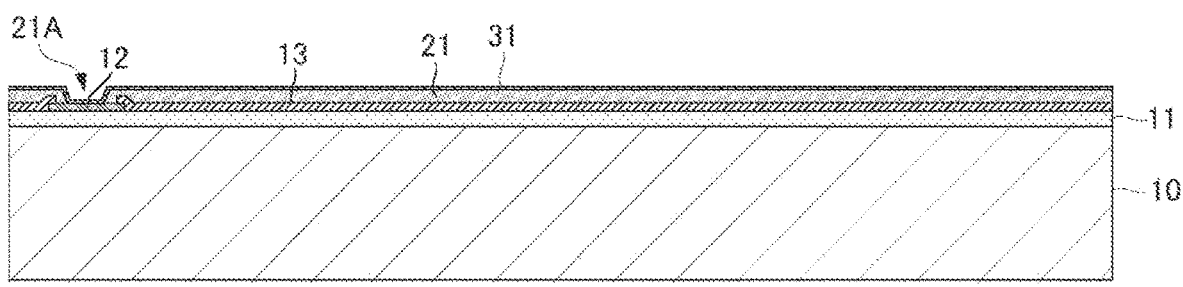
Figure 6D:
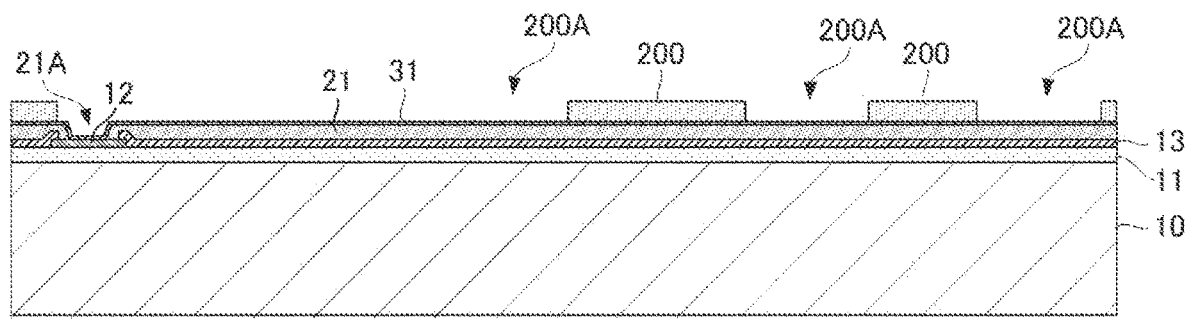
Figure 6E:
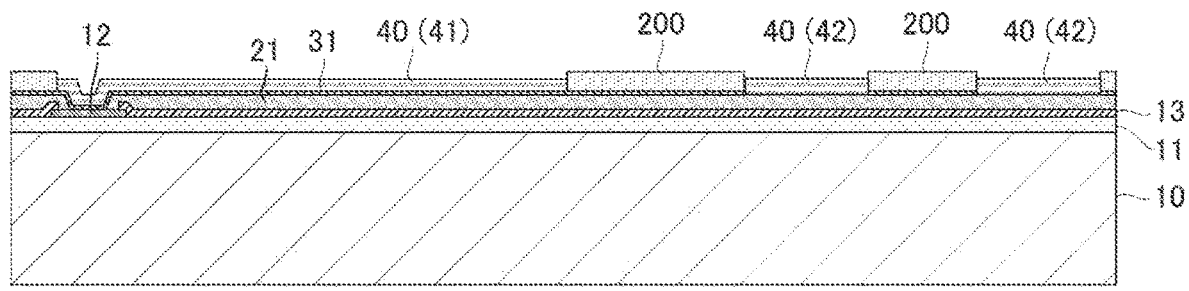
Figure 6F:
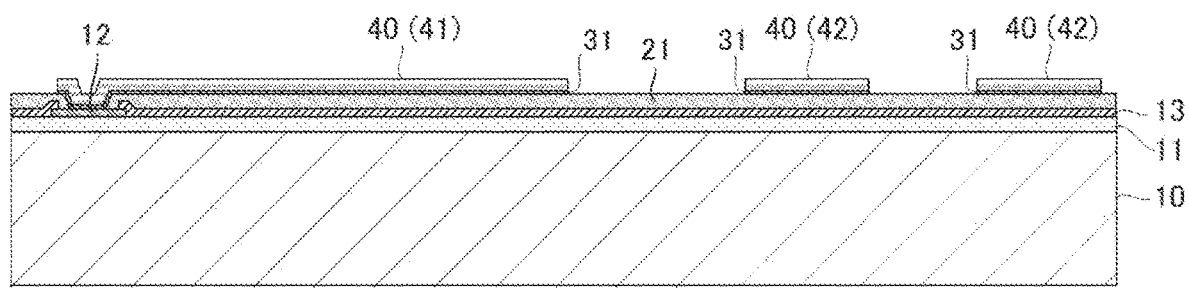
Figure 6G:
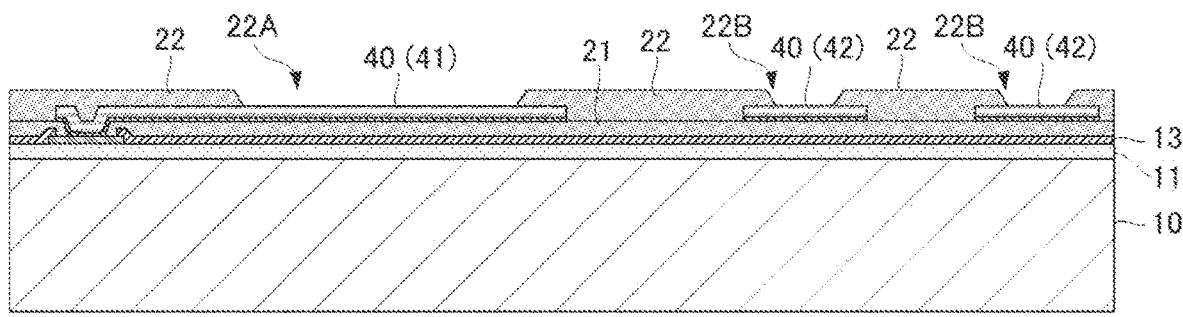
Figure 6H:
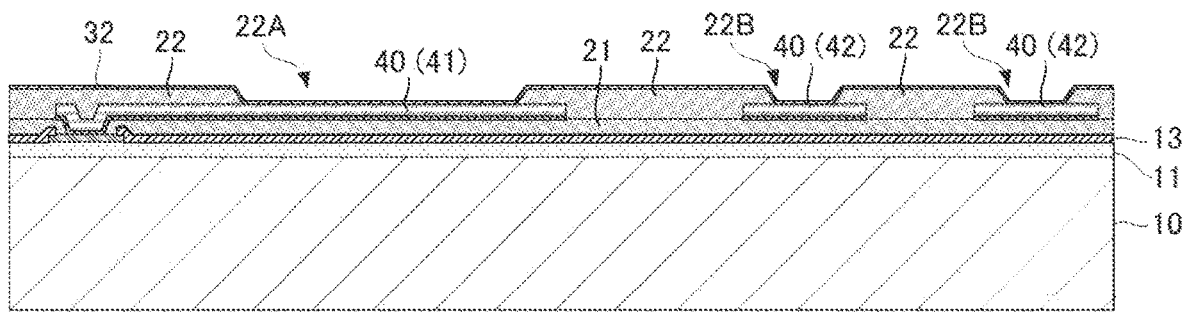
Figure 6I:
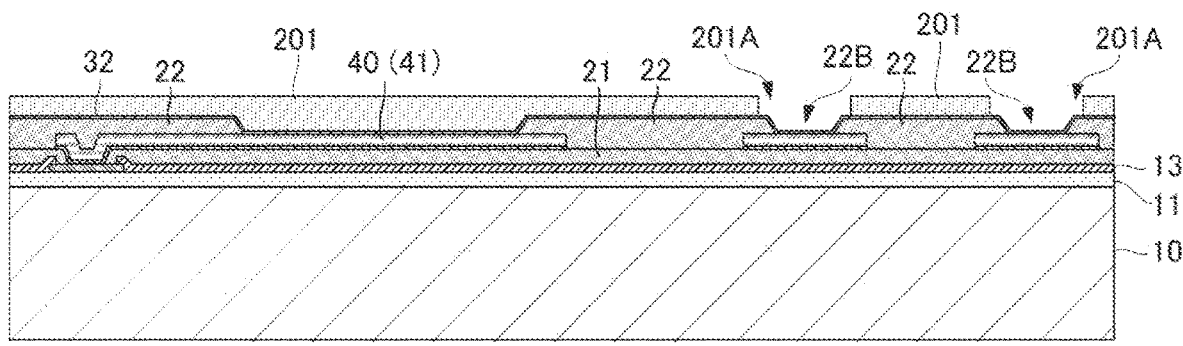
Figure 6J:
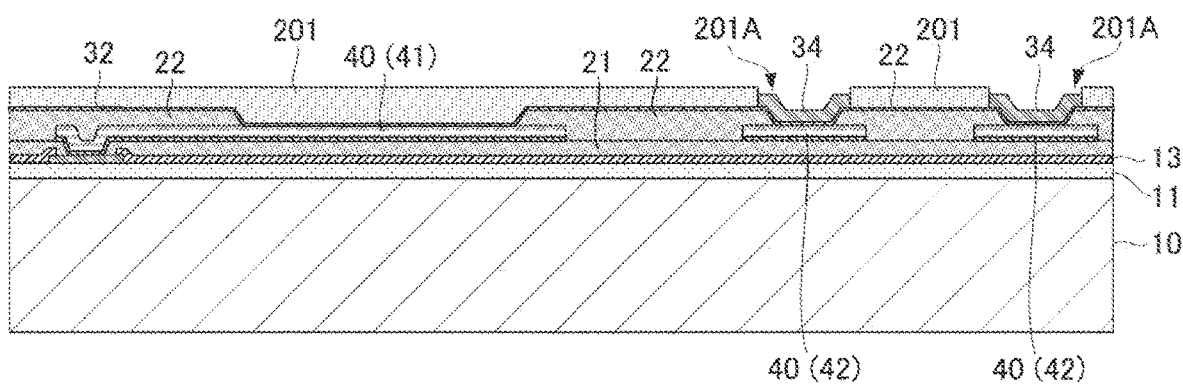
Figure 6K:
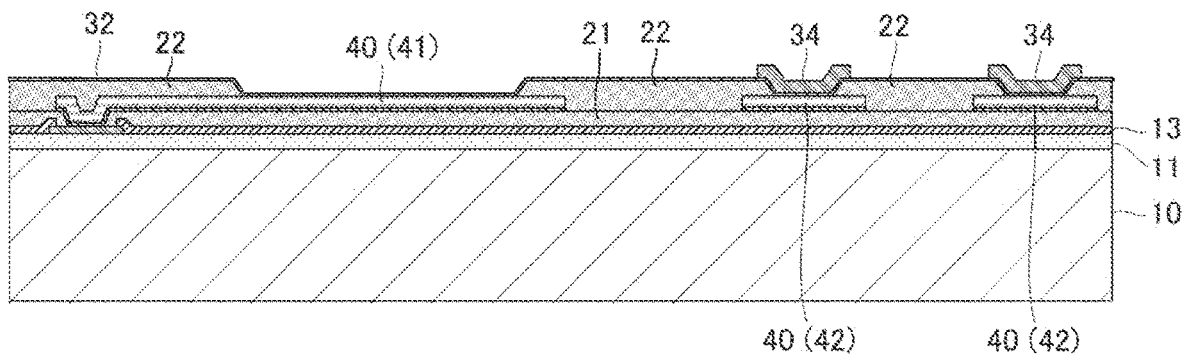
Figure 6L:
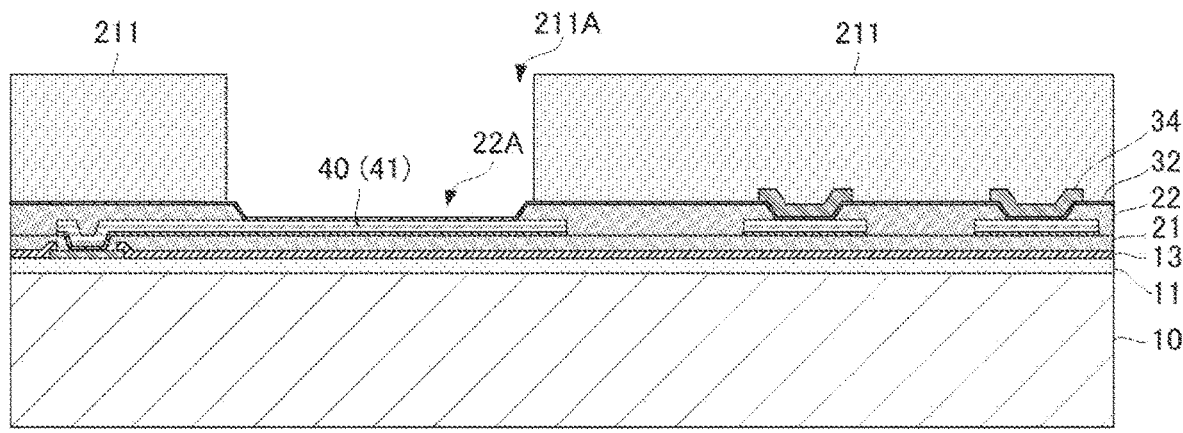
Figure 6M:
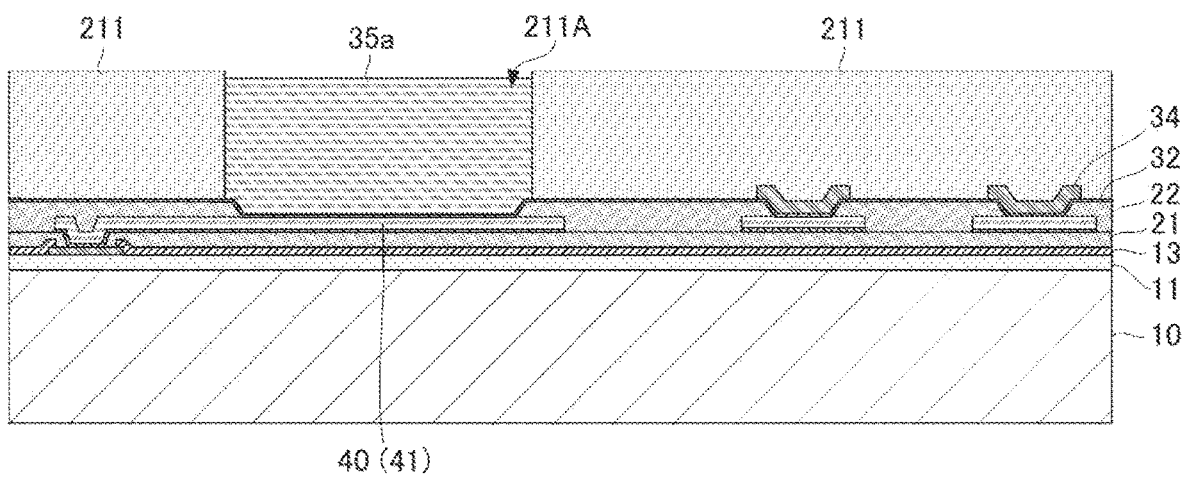
Figure 6N:
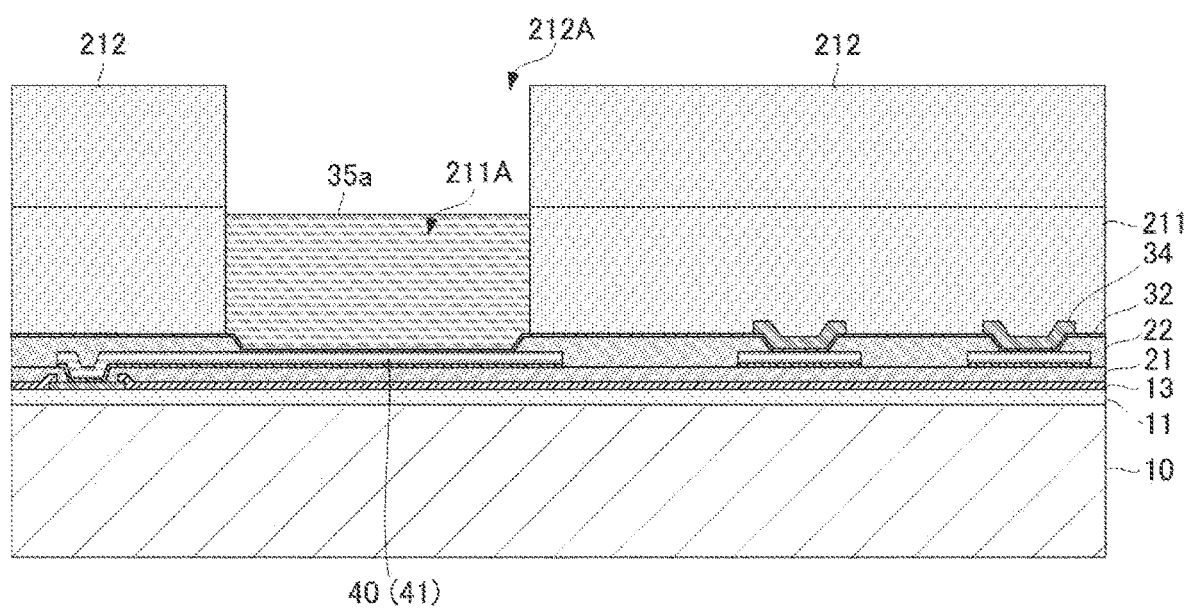
Figure 6O:
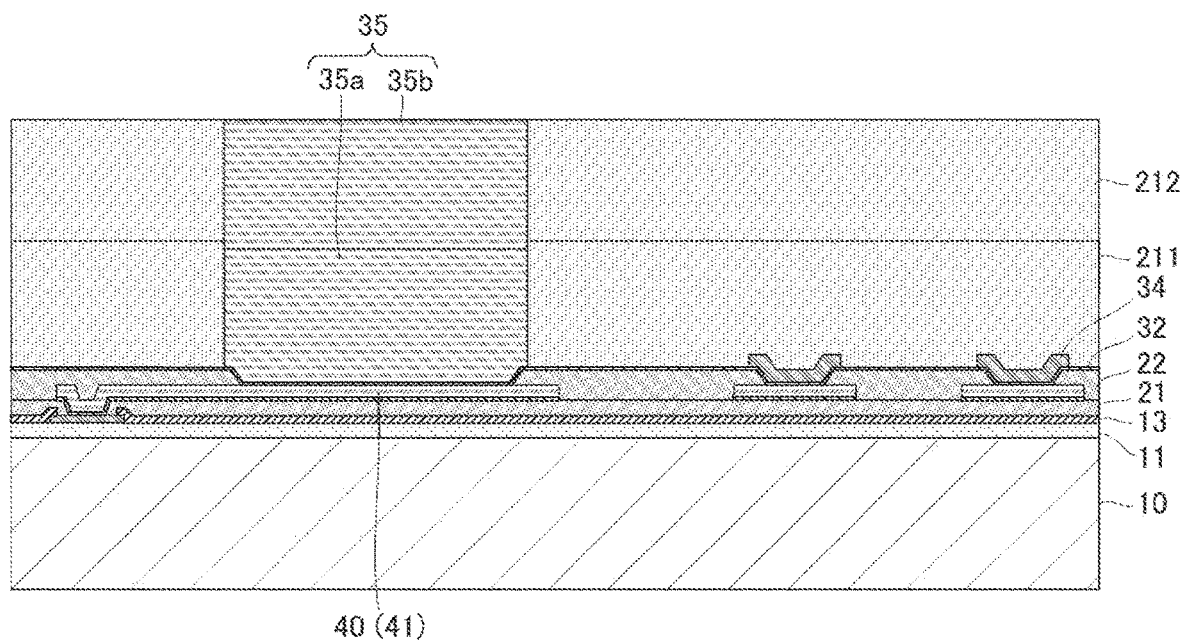
Figure 6P:
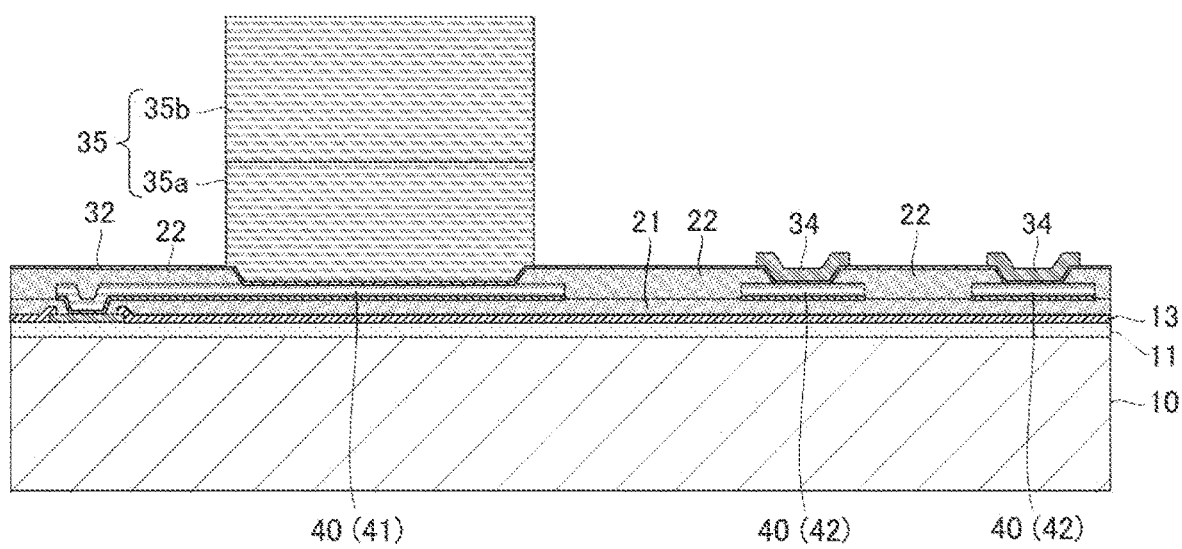
Figure 6Q:
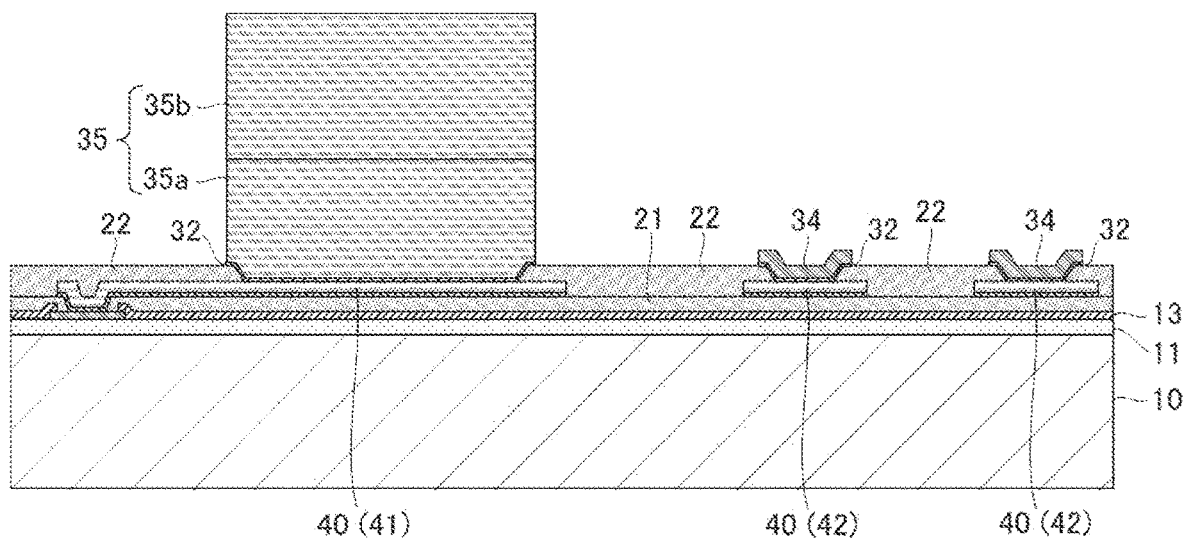
Figure 6R:
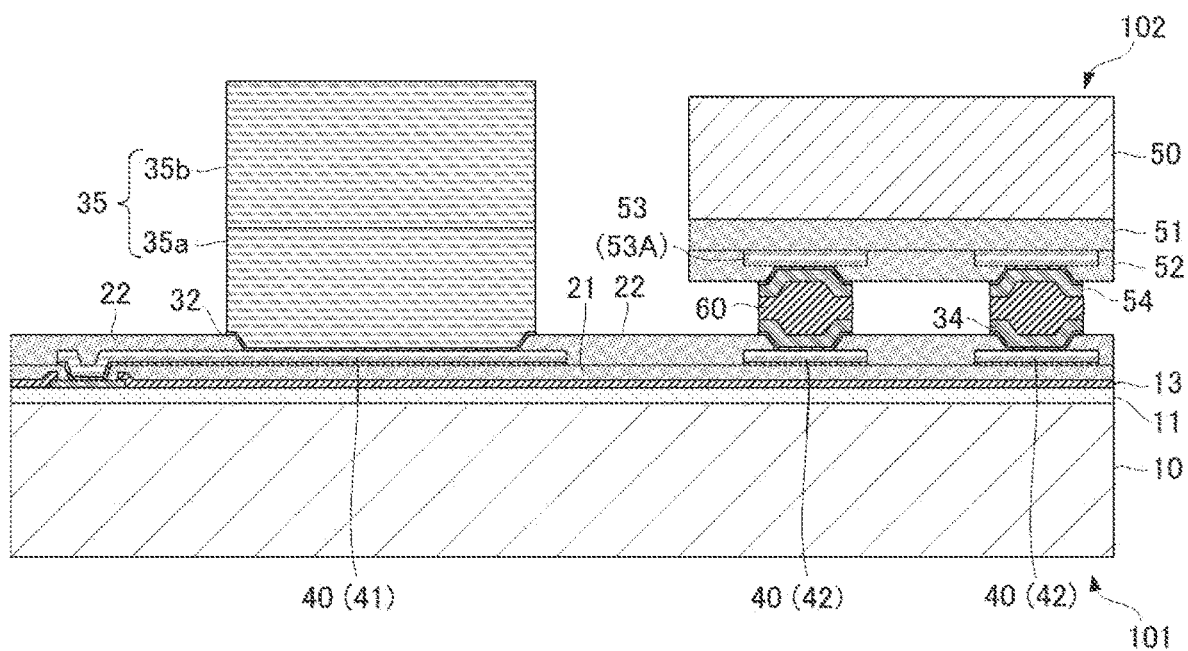
Figure 6S:
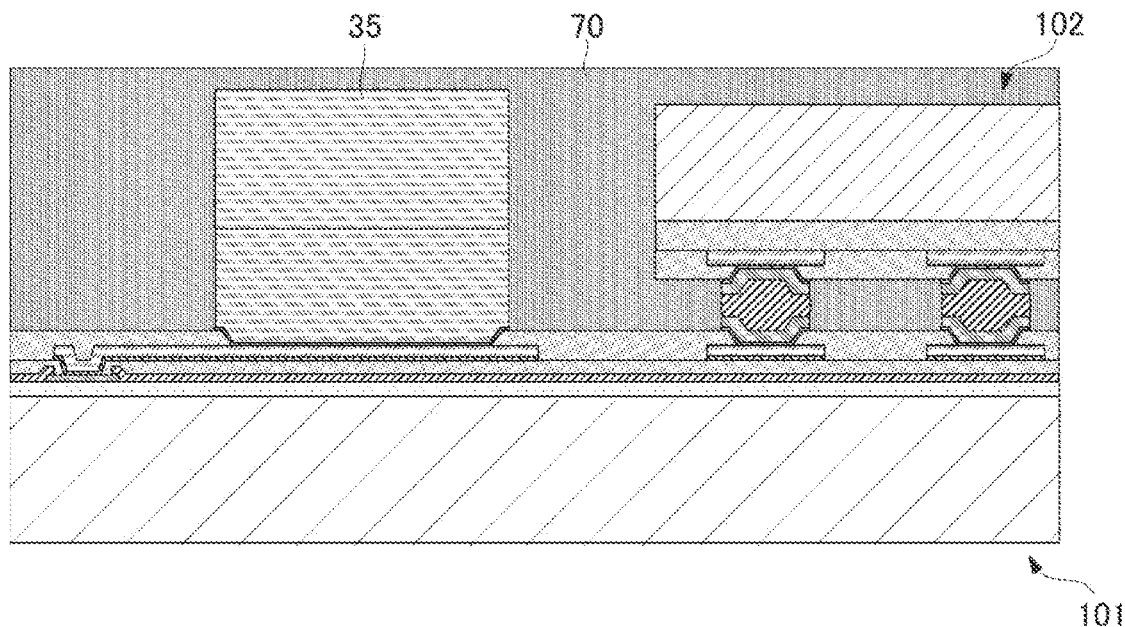
Figure 6T:
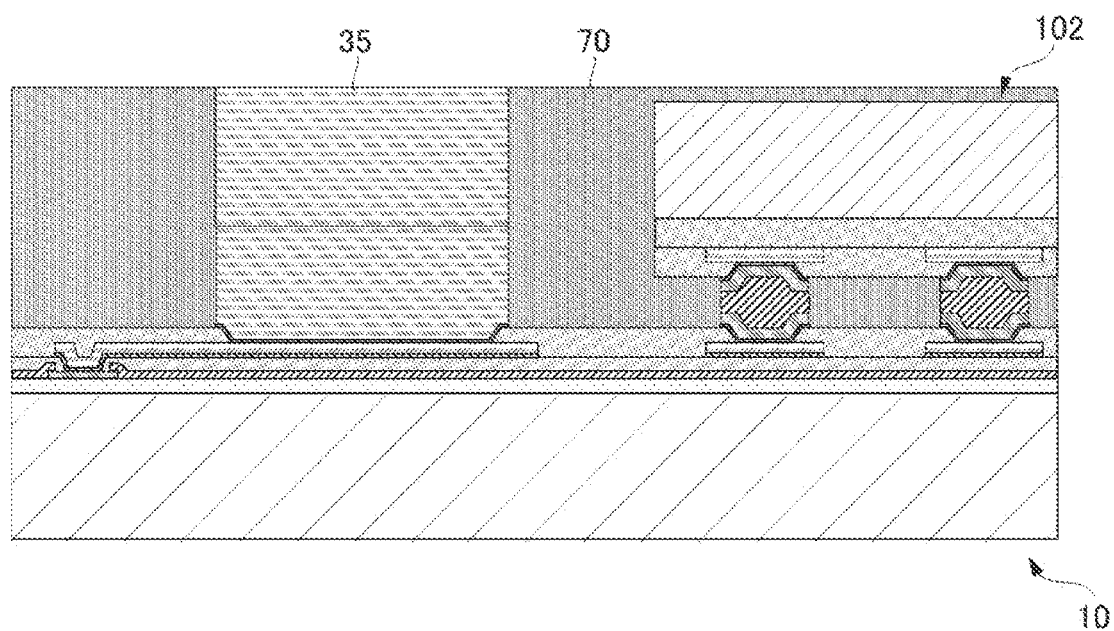
Figure 6U:
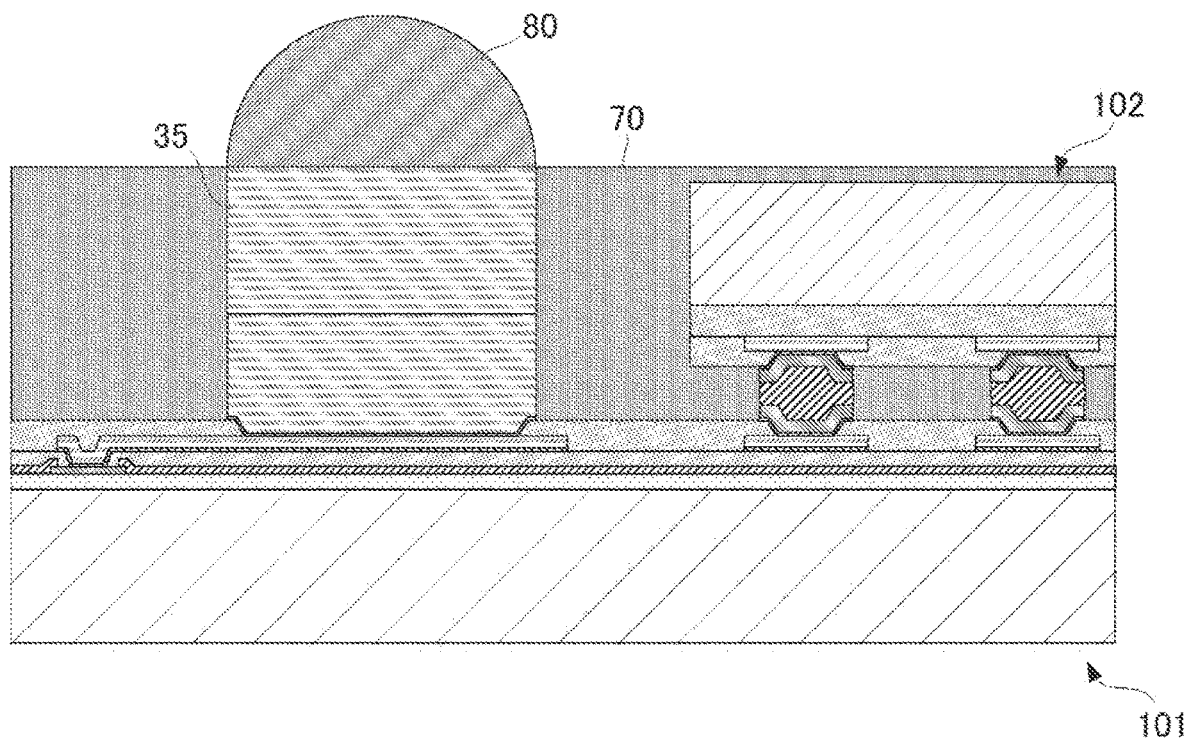

Explanation follows regarding a method of manufacturing the semiconductor device 1 according to the present exemplary embodiment, with reference to FIG. 6A to FIG. 6U. FIG. 6A to FIG. 6U are cross-sectional views illustrating manufacturing processes of the semiconductor device 1.

First, a semiconductor wafer on which the manufacturing processes of the first semiconductor chip 101 have been completed is prepared (FIG. 6A). The manufacturing processes of the first semiconductor chip 101 include forming circuit elements (not illustrated in the drawings) such as transistors on the semiconductor substrate 10; forming the inter-layer insulating film 11, configured by an insulator such as $SiO_2$, on the front face of the semiconductor substrate 10; forming the chip electrodes 12 on the front face of the inter-layer insulating film 11; and forming the passivation film (protective film) 13 on the front face of the inter-layer insulating film 11 such that the chip electrode 12 is partially exposed.

Next, for example, a spin coating method is employed to coat the front face of the first semiconductor chip 101 with a photosensitive organic insulating material such as polyimide or PBO, thereby forming the lower-layer insulating film 21 that covers the front faces of the passivation film 13 and the chip electrodes 12. Then, exposure and developing processing is performed on the lower-layer insulating film 21 to form the openings 21A partially exposing the front faces of the chip electrodes 12 in the lower-layer insulating film 21. The lower-layer insulating film 21 is then cured using thermal processing (FIG. 6B).

Next, the first UBM film 31 is formed covering the front face of the lower-layer insulating film 21 and the front face of the chip electrodes 12 exposed through the openings 21A (FIG. 6C). The first UBM film 31 is, for example, formed by successively forming a Ti film and a Cu film using a sputtering method. The Ti film functions as an adhesion layer to increase adhesion between the lower-layer insulating film 21 and the redistribution lines 40. The Cu film functions as a plating seed layer used to form the redistribution lines 40 in an electroplating method.

Next, known photolithography technology is employed to form a resist mask 200 having openings 200A corresponding to the pattern of the redistribution lines 40 on the front face of the first UBM film 31 (FIG. 6D). The resist mask 200 is formed by coating the first UBM film 31 with a photosensitive resin and performing exposure and developing processing on the photosensitive resin.

Next, an electroplating method is employed to form the redistribution lines 40 on the front face of the first UBM film 31 (see FIG. 6E). Specifically, the front face of the semiconductor substrate 10 is immersed in a plating solution, and current is supplied to the plating electrodes (not illustrated in the drawings) connected to the first UBM film 31. Metal is thereby deposited on the exposed portions of the first UBM film 31 (plating seed layer) to form the redistribution lines 40 on the first UBM film 31. One end of each of the redistribution lines 40 is connected to a respective chip electrode 12. Either a first land 41 serving as a pedestal for a respective columnar electrode 35, or a second land 42 serving as a pedestal for a respective chip interconnection electrode 34, is formed at the other end of each of the redistribution lines 40. The redistribution lines 40 are formed such that the surface areas of the second lands 42 are less than the surface areas of the first lands 41. Cu, for example, may be employed as the material for the redistribution lines 40. In such cases, the plating seed layer configuring the first UBM film 31 is incorporated into the Cu of the redistribution lines 40. A structure is thereby obtained in which a Ti film, functioning as an adhesion layer, is interposed between the redistribution lines 40 and the lower-layer insulating film 21.

After forming the redistribution lines 40, the resist mask 200 is removed using a known ashing process or an organic solvent or the like. Unwanted portions of the first UBM film 31 that were covered by the resist mask 200 are then removed using the redistribution lines 40 as a mask (FIG. 6F).

Next, for example, a spin coating method is employed to coat the front face of the structure formed by the above processing with a photosensitive organic insulating material such as polyimide or PBO, thereby forming the upper-layer insulating film 22 covering the front faces of the lower-layer insulating film 21 and the redistribution lines 40. Then, the upper-layer insulating film 22 is subjected to exposure and developing processing to form, in the upper-layer insulating film 22, the first openings 22A and the second openings 22B partially exposing the front face of the redistribution lines 40. In plan view, the first openings 22A are formed in regions encompassed by the first lands 41. In plan view, the second openings 22B are formed in regions encompassed by the second lands 42. The upper-layer insulating film 22 is then cured using thermal processing (FIG. 6G).

Next, the second UBM film 32 is formed covering the front face of the upper-layer insulating film 22 and the front face of the redistribution lines 40 (the first lands 41 and the second lands 42) exposed through the first openings 22A and the second openings 22B (FIG. 6H). The second UBM film 32 is, for example, formed by successively forming a Ti film and a Cu film using a sputtering method. The Ti film functions as an adhesion layer to increase adhesion between the upper-layer insulating film 22 and the columnar electrodes 35, and between the upper-layer insulating film 22 and the chip interconnection electrodes 34. The Cu film functions as a plating seed layer used to form the columnar electrodes 35 and the chip interconnection electrodes 34 in an electroplating method.

Next, known photolithography technology is employed to form a resist mask 201 having openings 201A in regions for forming the chip interconnection electrodes 34 (FIG. 6I) on the front face of the second UBM film 32. The resist mask 201 is formed by coating the second UBM film 32 with a photosensitive resin and performing exposure and developing processing on the photosensitive resin. The openings 201A in the resist mask 201 encompass the second openings 22B of the upper-layer insulating film 22, and thereby expose the second openings 22B.

Next, an electroplating method is employed to form the chip interconnection electrodes 34 on the front face of the second UBM film 32 exposed through the openings 201A in the resist mask 201 (FIG. 6J). Specifically, the front face of the semiconductor substrate 10 is immersed in a plating solution, and current is supplied to the plating electrodes (not illustrated in the drawings) connected to the second UBM film 32. Metal is thereby deposited on the exposed portions of the second UBM film 32 (plating seed layer) to form the chip interconnection electrodes 34 on the second UBM film 32. The chip interconnection electrodes 34 are connected to the redistribution lines 40 (the second lands 42) through the second UBM film 32. Ni, which does not diffuse into solder containing SnAg, may preferably be employed as the material used for the chip interconnection electrodes 34. In such cases, a structure of stacked Ti, Cu, and Ni is obtained at portions where the front face of the redistribution lines 40 is exposed through the second openings. The second lands 42 and the chip interconnection electrodes 34 are formed such that a clearance, which is the shortest distance between the outer edges of the second lands 42 and the outer edges of the chip interconnection electrodes 34 in plan view, is less than, a clearance, which is the shortest distance between the outer edges of the first lands 41 and the outer edges of the columnar electrodes 35 formed thereafter in plan view.

Next, the resist mask 201 is removed using a known ashing process or an organic solvent or the like (FIG. 6K).

Next, a first dry film layer 211 is affixed to the front face of the structure formed by the above processing, so as to cover the front faces of the second UBM film 32 and the chip interconnection electrodes 34. The first dry film layer 211 is a photosensitive resist member in film form, and is, for example, affixed using an affixing machine. Exposure and developing processing is then performed on the first dry film layer 211 to form openings 211A at regions for forming the columnar electrodes 35. The openings 211A in the first dry film layer 211 encompass the first openings 22A in the upper-layer insulating film 22, and thereby expose the first openings 22A (FIG. 6L).

Next, an electroplating method is employed to form the lower-layer portions 35a of the columnar electrodes 35 on the front face of the second UBM film 32 exposed through the openings 211A in the first dry film layer 211 (FIG. 6M). Specifically, the front face of the semiconductor substrate 10 is immersed in a plating solution, and current is supplied to the plating electrodes (not illustrated in the drawings) connected to the second UBM film 32. Metal is thereby deposited on the exposed portions of the second UBM film 32 (plating seed layer) to form lower-layer portions 35a of the columnar electrodes 35 on the second UBM film 32. The lower-layer portions 35a of the columnar electrodes 35 are connected to the redistribution lines 40 (first lands 41) through the second UBM film 32. Note that the lower-layer portions 35a are preferably formed such that a height position of the upper faces of the lower-layer portions 35a of the columnar electrodes 35 is lower than the height position of the upper face of the first dry film layer 211. Cu, which is easy to work with, may preferably be employed as the material used for the columnar electrodes 35. In such cases, the Cu film functioning as a plating seed layer configuring the second UBM film 32 is incorporated into the Cu configuring the columnar electrodes 35. A structure is thereby obtained in which a Ti film, functioning as an adhesion layer, is interposed between the columnar electrodes 35 and the redistribution lines 40.

Next, a second dry film layer 212 is affixed to the front face of the first dry film layer 211. Similarly to the first dry film layer 211, the second dry film layer 212 is a photosensitive resist member in film form, and is, for example, affixed using an affixing machine. Exposure and developing processing is then performed on the second dry film layer 212 to form openings 212A at regions for forming the columnar electrodes 35. Namely, the openings 212A in the second dry film layer 212 are in communication with the openings 211A in the first dry film layer 211, and the lower-layer portions 35a of the columnar electrodes 35 are exposed through openings 212A in the second dry film layer 212 (FIG. 6N).

Next, an electroplating method is employed to form upper-layer portions 35b of the columnar electrodes 35 on the front faces of the lower-layer portions 35a of the columnar electrodes 35 exposed through the openings 212A in the second dry film layer 212 (FIG. 6O). Specifically, the front face of the semiconductor substrate 10 is immersed in a plating solution, and current is supplied to the plating electrodes (not illustrated in the drawings) connected to the second UBM film 32. Metal is thereby deposited on the front faces of the lower-layer portions 35a of the columnar electrodes 35 to form the upper-layer portions 35b of the columnar electrodes 35 on the front faces of the lower-layer portions 35a of the columnar electrodes 35. Note that the upper-layer portions 35b are preferably formed such that a height position of the upper faces of the upper-layer portions 35b of the columnar electrodes 35 is higher than the height position of the upper face of the second dry film layer 212. The first lands 41 and the columnar electrodes 35 are formed such that a clearance, which is the shortest distance between the outer edges of the second lands 42 and the outer edges of the chip interconnection electrodes 34 in plan view, is less than, a clearance, which is the shortest distance between the outer edges of the first lands 41 and the outer edges of the columnar electrodes 35 in plan view.

After forming the columnar electrodes 35, an organic stripping solution or the like is employed to remove the first dry film layer 211 and the second dry film layer 212 (FIG. 6P).

Next, unwanted portions of the second UBM film 32 that had been covered by the first dry film layer 211 are removed using the columnar electrodes 35 and the chip interconnection electrodes 34 as a mask (FIG. 6Q).

Next, the second semiconductor chip 102 is mounted on the first semiconductor chip 101 (FIG. 6R). The second semiconductor chip 102 is configured including the semiconductor substrate 50, the lower-layer insulating film 51, the redistribution lines 53 including the third land portion 53A, the upper-layer insulating film 52, and the chip interconnection electrodes 54. A clearance, which is the shortest distance between the outer edges of the third lands 53A and the outer edges of the chip interconnection electrodes 54 in plan view, is less than, a clearance, which is the shortest distance between the outer edges of the first lands 41 and the outer edges of the columnar electrodes 35 in plan view. The surface areas of the third lands 53A is less than the surface areas of the first lands 41.

The first semiconductor chip 101 and the second semiconductor chip 102 are, for example, joined using the solder terminals 60 containing SnAg. Specifically, the solder terminals 60 are formed on the chip interconnection electrodes 54 on the second semiconductor chip 102 side, and then, reflow processing is performed in a state in which the solder terminals 60 are in contact with the chip interconnection electrodes 34 on the first semiconductor chip 101 side. The chip interconnection electrodes 34 and 54 are configured using Ni, which does not diffuse into the solder terminals 60, enabling the reliability of the connections between the first semiconductor chip 101 and the second semiconductor chip 102 to be improved compared to cases in which the chip interconnection electrodes 34 and 54 contain Cu, which is the material configuring the columnar electrodes 35. Note that although in the present exemplary embodiment explanation has been given regarding an example in which the chip interconnection electrodes 34 on the first semiconductor chip 101 side are configured using Ni, the chip interconnection electrodes 34 may also be configured by a film stack in which Ni and SnAg have been stacked.

Next, for example, a screen printing method is employed to coat the front face of the structure formed by the above processing with the encapsulation resin 70. The columnar electrodes 35 and the second semiconductor chip 102 are embedded within the encapsulation resin 70. The encapsulation resin 70 is then cured using thermal processing (FIG. 6S).

Next, a grinder is employed to grind the front face of the encapsulation resin 70 and expose the tips of the columnar electrodes 35. The back face of the first semiconductor chip 101 (the face on the opposite side to the side on which the second semiconductor chip 102 has been mounted) may be ground as necessary to make the semiconductor device 1 thinner (FIG. 6T). Moreover, although in the present exemplary embodiment the back face of the second semiconductor chip 102 (the face on the opposite side to the face joined to the first semiconductor chip 101) is covered by the encapsulation resin 70, the back face of the second semiconductor chip 102 may be exposed from the encapsulation resin 70.

Next, the external connection terminals 80 are formed on the tips of the columnar electrodes 35 exposed from the encapsulation resin 70 (FIG. 6U). The external connection terminals 80 are, for example, formed by performing reflow processing after placing solder balls containing SnAg, for example, on the tips of the columnar electrodes 35. The external connection terminals 80 may also be formed by forming a conductive paste containing SnAg, for example, on the tips of the columnar electrodes 35 using screen printing, and then performing reflow processing.

The external connection terminals 80 of the semiconductor device 1 manufactured through the above processes are joined to a wiring substrate (not illustrated in the drawings) so as to mount the semiconductor device 1 on the wiring substrate. Making the clearance C1 of the first lands 41 of the redistribution lines 40 connected to the external connection terminals 80 through the columnar electrodes 35 comparatively large, may alleviate the effect of stress on the lower-layer of the redistribution lines 40 transmitted through the external connection terminals 80 from outside, after mounting the semiconductor substrate 10 on the wiring substrate.

Since the solder terminals 60 that form the joints between the chip interconnection electrodes 34 and the chip interconnection electrodes 54, and the area around the second semiconductor chip 102, are covered by the encapsulation resin 70, the effect of stress on the lower-layer of the redistribution lines 40 transmitted through the solder terminals 60 from outside may become comparatively small. Thus, it is possible to make the clearance C2, which is the shortest distance between the outer edges of the second lands 42 and the outer edges of the chip interconnection electrodes 34 in plan view, to be less than the clearance C1, which is the shortest distance between the outer edges of the first lands 41 and the outer edges of the columnar electrodes 35 in plan view.

Making the clearance C2 be less than the clearance C1 enables the surface area of the second lands 42 to be less than the surface area of the first lands 41. Therefore, it is possible to reduce the surface area occupied by redistribution lines on the main face of the first semiconductor chip 101 in the region where the second semiconductor chip 102 is mounted. The amount of warpage arising in a semiconductor chip increases in accordance with an increase in the surface area occupied by the redistribution lines provided on the main face of the semiconductor chip. In the semiconductor device 1 according to the exemplary embodiment of the present disclosure, the surface area occupied by the redistribution lines 40 provided on the main face of the first semiconductor chip 101 may be reduced, and thus, the occurrence of warpage in the first semiconductor chip 101 may be suppressed. Alternatively, the amount of warpage arising in the first semiconductor chip 101 may be reduced.

Similar applies to the second semiconductor chip 102, in which the clearance C3, which is the shortest distance between the outer edges of the third lands 53A and the outer edges of the chip interconnection electrodes 54 in plan view, is made to be less than the clearance C1. By making the clearance C3 to be less than the clearance C1, the surface area of the third lands 53A becomes less than the surface area of the first lands 41. Accordingly, the surface area occupied by redistribution lines on the main face of the second semiconductor chip 102 may be reduced. Thus, the occurrence of warpage in the second semiconductor chip 102 may be suppressed. Alternatively, the amount of warpage arising in the second semiconductor chip 102 may be reduced.

Figure 7A:
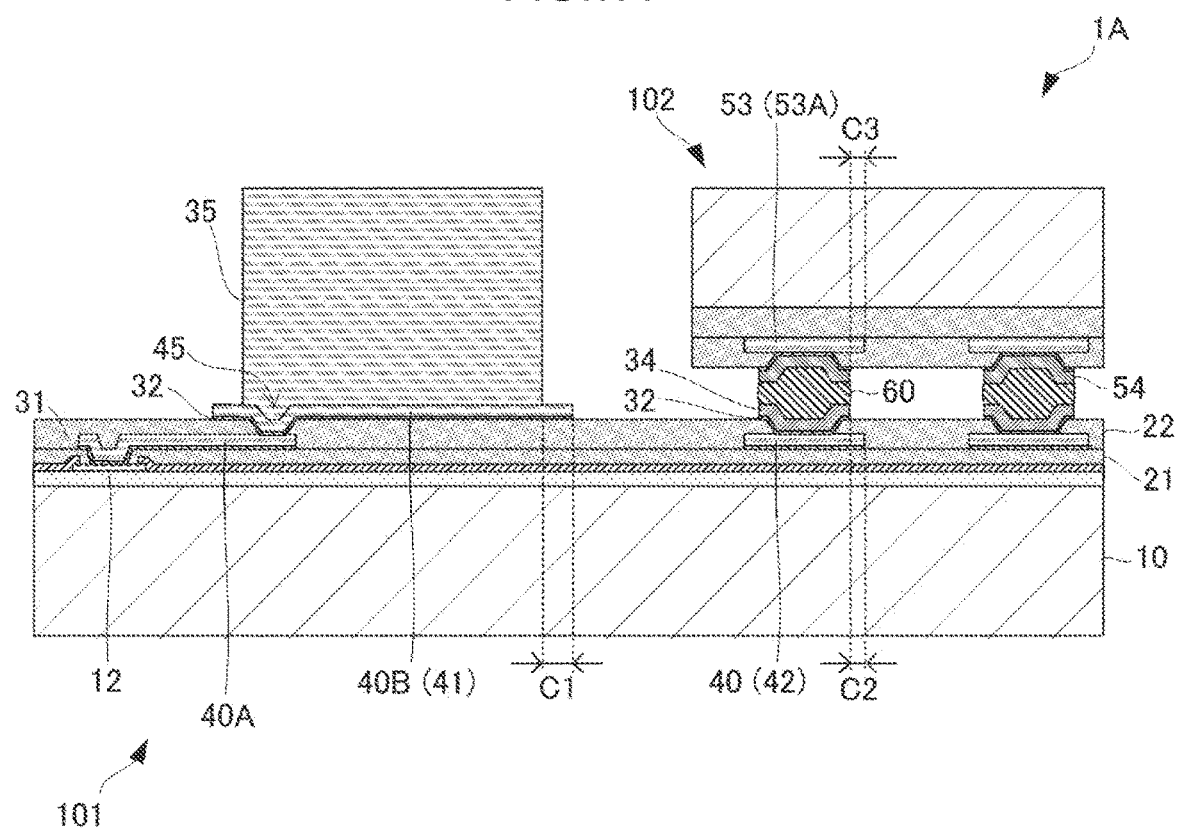
FIG. 7A and FIG. 7B are enlarged cross-sectional views illustrating configuration of part of semiconductor devices according to other exemplary embodiments of the present disclosure.
Figure 7B:
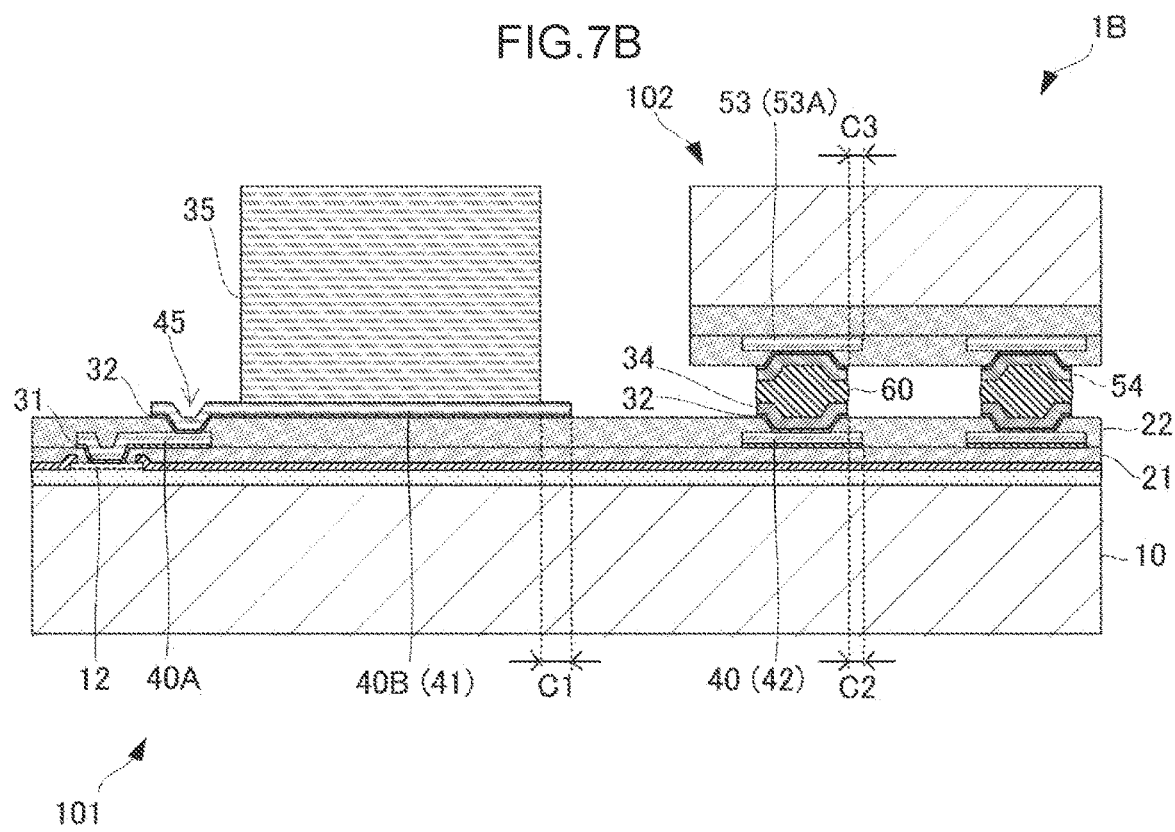

FIG. 7A and FIG. 7B are cross-sectional views respectively illustrating configuration of part of a semiconductor device 1A according to a second exemplary embodiment of the present disclosure and a semiconductor device 1B according to a third exemplary embodiment of the present disclosure. Note that illustration of the encapsulation resin 70 and the external connection terminals 80 is omitted from FIG. 7A and FIG. 7B.

The semiconductor devices 1A and 1B differ from the semiconductor device 1 according to the first exemplary embodiment described above, in that the redistribution lines on the first semiconductor chip 101 side are configured including first redistribution lines 40A that are provided on a first wiring layer, and second redistribution lines 40B that are provided on a second wiring layer distinct from the first wiring layer and that is connected to the first redistribution lines 40A. The first redistribution lines 40A are provided on the lower-layer insulating film 21. Second lands 42 functioning as pedestals for the chip interconnection electrodes 34 are provided as part of the first redistribution lines 40A. The second redistribution lines 40B are provided on the upper-layer insulating film 22. First lands 41 functioning as pedestals for the columnar electrodes 35 are provided at the ends of the second redistribution lines 40B.

In the semiconductor device 1A, contacts 45 connecting the first redistribution lines 40A and the second redistribution lines 40B are disposed in regions directly below the columnar electrodes 35. In the semiconductor device 1B, contacts 45 connecting the first redistribution lines 40A and the second redistribution lines 40B are disposed at positions offset, in plan view, from the regions where the columnar electrodes 35 are formed.

In the semiconductor devices 1A and 1B, the clearance C2, which is the shortest distance between the outer edges of the second lands 42 and the outer edges of the chip interconnection electrodes 34 in plan view, is less than the clearance C1, which is the shortest distance between the outer edges of the first lands 41 and the outer edges of the columnar electrodes 35 in plan view. The surface area of the second lands 42 is also less than the surface area of the first lands 41.

Accordingly, similar effects to that of the semiconductor device 1 according to the first exemplary embodiment described above can be obtained by the semiconductor devices 1A and semiconductor device 1B.

Note that the first semiconductor chip 101 is an example of a first semiconductor chip of the present disclosure. The second semiconductor chip 102 is an example of a second semiconductor chip of the present disclosure. The redistribution lines 40 are examples of a redistribution line of the present disclosure. The first lands 41 are examples of a first land of the present disclosure. The second lands 42 are examples of a second land of the present disclosure. The columnar electrodes 35 are examples of a first electrode of the present disclosure. The chip interconnection electrodes 34 are examples of a second electrode of the present disclosure. The chip interconnection electrodes 54 are examples of a third electrode of the present disclosure. The encapsulation resin 70 is an example of an encapsulation portion of the present disclosure. The external connection terminals 80 are examples of an external connection terminal of the present disclosure.

What is claimed is:

1. A semiconductor device manufacturing method comprising:
    forming, on a main face of a first semiconductor chip, a plurality of redistribution lines including a redistribution line that includes a first land and a redistribution line that includes a second land, the second land having a surface area that is less than a surface area of the first land;
    forming a first electrode in a region encompassed by the first land in plan view, one end of the first electrode in a stacking direction of the first semiconductor chip and the plurality of redistribution lines being connected to the first land;
    forming a second electrode in a region encompassed by the second land in plan view, one end of the second electrode in the stacking direction being connected to the second land;
    connecting a third electrode provided on a main face of a second semiconductor chip to the second electrode to mount the second semiconductor chip on the first semiconductor chip; and
    forming an external connection terminal on another end of the first electrode in the stacking direction,
    wherein a shortest distance between an outer edge of the second land and an outer edge of the second electrode in plan view, is less than, a shortest distance between an outer edge of the first land and an outer edge of the first electrode in plan view, and
    wherein said forming the plurality of redistribution lines includes
    forming a first redistribution line provided to a first wiring layer, and including the second land, and
    forming a second redistribution line provided to a second wiring layer distinct from the first wiring layer, connected to the first redistribution line, and including the first land.

2. The manufacturing method of claim 1, further comprising:
    forming, on the main face of the second semiconductor chip, a third redistribution line that includes a third land having a surface area that is less than the surface area of the first land; and
    forming the third electrode in a region encompassed by the third land in plan view, one end of the third electrode in the stacking direction is connected to the third land,
    wherein a shortest distance between an outer edge of the third land in plan view is less than the shortest distance between the outer edge of the first land and the outer edge of the first electrode in plan view.

3. The manufacturing method of claim 1, further comprising forming an encapsulation portion that covers a joint between the second electrode and the third electrode, and an area around the second semiconductor chip.

* * * * *